United States Patent [19]

[11] 3,914,128

[45] Oct. 21, 1975

Scheiber et al.

[54] PHOTOHARDENABLE PASTE COMPOSITIONS HAVING HIGH RESOLUTION

[75] Inventors: David Hitz Scheiber; Richard Vroman Weaver, both of Wilmington, Del.

[73] Assignee: E. I. Du Pont de Nemours & Company, Wilmington, Del.

[22] Filed: June 8, 1973

[21] Appl. No.: 368,316

[52] U.S. Cl. .................... 96/115 P; 96/34; 96/35.1; 96/36.2; 96/115 R; 204/159.18; 204/159.23

[51] Int. Cl.$^2$ ... G03C 5/00; G03C 7/00; G03C 1/68

[58] Field of Search .......... 96/115 P, 35.1, 36.2, 34, 96/115 R; 204/159.18, 159.23

[56] References Cited

UNITED STATES PATENTS

| | | | |
|---|---|---|---|
| 3,203,801 | 8/1965 | Heiart | 96/87 |
| 3,573,908 | 4/1971 | Minetti | 96/34 |
| 3,615,457 | 10/1971 | Selbert et al. | 96/34 |
| 3,625,696 | 12/1971 | Krauch et al. | 96/86 P |
| 3,661,635 | 5/1972 | Harrison | 96/34 |

OTHER PUBLICATIONS

Bluhm et al., Nature, Vol. 215, Sept. 30, 1967, pp. 1475–1476.

*Primary Examiner*—Norman G. Torchin
*Assistant Examiner*—J. P. Brammer

[57] ABSTRACT

A film-forming photohardenable paste composition comprising solid inorganic particulate material, a photohardenable polymeric or monomeric composition, a nitroso dimer and chromium provides a screen-printable paste composition with improved resolution compatible with thick-film techniques used for fabricating electrically conductive and dielectric patterns and layers on substrates for electronic circuits.

19 Claims, No Drawings

PHOTOHARDENABLE PASTE COMPOSITIONS HAVING HIGH RESOLUTION

BACKGROUND OF THE INVENTION

1. Field of the Invention

This invention relates to photosensitive compositions containing inorganic particulate material and particularly relates to photopolymer compositions containing such particulate material. More particularly, it relates to improved resolution photohardenable paste compositions suitable for screen-printing and firing using thick-film techniques.

2. Description of the Prior Art

Metallizing compositions containing finely divided noble metal or dielectric inorganic particulate material are well-known for use in the art of preparing conductor and dielectric patterns or layers on substrates. Similarly, photoresist compositions are wellknown in the art for producing resist patterns on substrates and subsequent treatment of the substrate in the areas which have been imagewise exposed and developed. U.S. Pat. No. 3,573,908 discloses a process for the preparation of a ceramic substrate glaze using a mixture of a photoresist, a multicomponent oxide glaze frit, and a solvent. British Pat. No. 1,256,344 discloses applying a combination of a particulate metal, glass binder, photosensitive material, and solvent on the surface of the substrate and drying, exposing and developing it. The pattern provided is then fired to produce a printed circuit.

It is known that aromatic nitroso compounds are useful as polymerization inhibitors. For example, Hungarian Patent 150,550 (1963) describes the use of p-aminonitrosobenzene and α-nitroso-β-naphthol as inhibitors for the free radical polymerization of styrene. It is also known that N-nitrosocyclohexylhydroxylamine salts serve as thermal polymerization inhibitors in the preparation of photopolymers (U.S. Pat. No. 3,625,696, 12/7/71). Similarly, 4-nitrosophenol, 1,4-dinitrosobenzene, nitrosoresorcinol, p-nitrosodimethyl-aniline and other nitroso monomers have been found effective as inhibitors for styrene and vinyl acetate polymerizations [Hartel, Chimia (Aarau)], 19, 116 (1965); Tudos, et al., Kinetika i Kataliz., 6, 203 (1965). Heiart, U.S. Pat. No. 3,203,801 patented 8/31/65 has described the use of N-substituted p-nitrosoanilines as sensitometric modifiers in photopolymerization systems.

It is also known that aliphatic nitroso dimers can be dissociated to monomers, either thermally or by irradiation with short wavelength ultraviolet light [Bluhm and Weinstein, Nature, 215, 1478 (1967)]. Photolysis of nitroso monomers has been reported to produce nitroxides, and it is known that a nitroxide is formed when alkyl radicals add to a nitroso compound [Mackor et al., Tetrahedron Letters 2115 (1966)].

The photosensitive compositions containing inorganic particulate material of the prior art have not found complete acceptance in the electronic industry for fabricating electronic circuits, as they are not readily compatible with either thin film or thick-film techniques commonly employed for that purpose. The photohardenable paste compositions of this invention and their process of use by screen-printing are readily compatible with commonly employed thick-film techniques and systems used for fabricating electronic circuits. The compositions of the invention due to the uniform dispersion and suspension of constituents may be prepared and packaged as paste, suitable for screen printing, thus obviating the requirement that the circuit manufacturer become involved with the mixing of photoresist solutions, the dispersion of the inorganic particulate material in the resist composition, and complex coating of the composition on substrates. Additionally, screen-printing the compositions provides for application on selected areas of a substrate, thus substantially reducing waste of photohardenable material and increasing yields. This can be very important where the inorganic particulate material is a valuable noble metal, e.g., gold, silver, palladium or platinum

SUMMARY OF THE INVENTION

According to the present invention, there is provided a photohardenable paste composition comprising a dispersion in a liquid vehicle of finely divided inorganic particulate material, a photohardenable polymeric or monomeric composition, organic sensitizer, at least one nitroso dimer, and chromium.

Also provided is a process for preparing highresolution patterns or layers of sintered or fused films of inorganic material comprising the steps of screen-printing the compositions of the invention on a substrate, imagewise exposing the screen-printed pattern through a mask or transparency to actinic radiation to photoharden the exposed or unexposed areas of the printed pattern, removing the unhardened areas, and firing the adherent photohardened areas to produce sintered or fused films of the inorganic material and decompose or burn the photohardened material. The resultant sintered or fused films may be electrical conductors, resistors, or insulators having resistivities, e.g., from $10^{-3}$ up to $10^{13}$ ohms/square or greater, dependent on the selection of the inorganic particulate material. The firing temperature is generally 400°–1000°C.

The nitroso dimers of the compositions of this invention preferably consist of at least one nitroso dimer having a dissociation constant in solution at 25°C. of about $10^{-2}$ to about $10^{-10}$ and a rate of dissociation in solution with half-life comparable to the exposure time of the photohardenable paste. The nitroso dimer may be present in an amount from about 0.01% to 1.0%, by weight, of the photohardenable paste, and is preferably present from 0.03% to 0.60%, by weight, of the photohardenable paste. The chromium compound of the compositions of the invention is preferably $Cr_2O_3$, and may be present to provide as chromium from 0.05% to 7.0%, by weight, of the paste composition, and preferably as chromium from 0.5% to 5%, by weight, of the paste composition.

The photohardenable paste compositions of the invention may be photoimaged to produce high resolution conductor or dielectric lines and vias, e.g., up to and less than 1 mil lines and 3 mils vias.

The screen-printable photohardenable paste compositions of the invention produce the smooth coatings required for fabricating thin multilayer circuit elements, and eliminate the necessity of coating an entire substrate. The screen-printed patterns of layers may contain a high loading of particulate solids, e.g., up to about 85% of the composition, providing the required functionality of the patterns or layers as conductive or dielectric elements in electronic circuits. If required more than one inorganic phase or layer may be successively applied and imaged while substantially maintaining the high resolution desired.

DETAILED DESCRIPTION OF THE INVENTION

The photohardenable compositions of the invention are specifically formulated as a paste. A paste may generally be defined as a soft plastic mixture or composition and may be specifically defined for the purpose of this invention as being semi-fluid and having sufficient fluidity to permit screen printing and sufficient viscosity to substantially retain its form on application to a substrate. Paste compositions of this invention will have a viscosity in the range of about 5,000 to 1,000,000 centipose as measured by a Brookfield viscometer at the application temperature, e.g., 23°C., and will preferably have a viscosity in the range of 10,000 to 100,000 centipose.

The present invention is directed to photohardenable paste compositions which can provide higher resolution than prior art compositions. Line and space resolution for the purpose of this invention may be defined as the minimum line and space, such that lines can be made functionally continuous, e.g., electrically conductive or insulative, and completely non-contiguous to adjacent lines at a given thickness, or range of thicknesses. Similarly, resolution may be defined for vias, i.e., void or open areas in otherwise functionally continuous dielectric or conductive layers, as the minimum transverse dimension of an opening at a given coating thickness or range of thicknesses. Resolutions for vias may be further defined as the ratio of the minimum transverse dimension of the opening or void divided by the unfired thickness of the coated layer or film. This ratio is critical in obtaining correlation between the area dimensions of the via and the area dimension of the mask through which the coated layer or film is imagewise exposed to actinic radiation. The smaller the ratio, as defined above, the higher the resolution between the dimensions of the via and the mask. A ratio in the range of 5–10 is desirable to reproducibly image vias in the coated layer or films. The compositions and process of the present invention repeatedly produce vias with a resolution as defined above in the range of 5–1.

In the photohardening process, light is normally absorbed to provide the photo-initiating species. The amount of light available for photohardening will therefore decrease progressively from the surface downwards. In the thicker layers of the paste photohardening will be correspondingly less rapid. At the same time, light will be scattered into nonilluminated areas by the film and by reflection from the substrate and by particulate material in the coated layer or film. Further active photo-initiating species can diffuse from illuminated to non-illuminated areas. These features tend to limit resulution.

Inhibitors can improve resolution by preventing photohardening until a sufficient amount of photo-initiating species has been generated to consume the inhibitor, whereupon photohardening will then proceed. Since the light entering non-illuminated areas by scattering, etc. generally has a lesser intensity than in the illuminated areas, the effect of the inhibition is greatest in such areas. The effect is offset by the retardation of photohardening in the illuminated areas of the photohardenable paste compositions.

The present invention employs an inhibitor system wherein the inhibitor species is produced relatively slowly and in small amounts by dissociation of a non-inhibiting species. Thus, there is created a threshold value of illumination for photohardening. Below the threshold value inhibitor species are produced as fast as they are consumed by reaction with the active initiator radical. Thus, photohardening will be retarded for a prolonged period until all of the source of inhibiting species has been decomposed. Above the threshold value of illumination the concentration of inhibiting species is maintained at an extremely low level, and photohardening can proceed. By proper balancing of the initiator, the inhibitor source, opacity of the paste, exposure intensity and time, improved resolution can be attained compared with prior art compositions.

The inhibitor sources of the present invention are dimeric nitroso compounds characterized by 1. a dissociation constant of about $10^{-2}$ to about $10^{-10}$ in solution.
2. a rate of dissociating having a half-life comparable with the exposure times employed, i.e., from about 5 seconds to about 30 minutes or more at operating temperature.

The chemical structure of the nitroso generating species is not critical provided other groups capable of inhibiting free radical reactions are absent. In general, nitroso dimers have nitroso groups attached to primary or secondary aliphatic or alicyclic carbon atoms, and some aliphatic or alicyclic nitroso compounds wherein the nitroso group is attached to a tertiary carbon atom are suitable. Two or more nitroso groups may be attached to the same molecule and the association of the nitroso groups to the dimeric form may be intra- rather than intermolecular. The actual form of the dimer, whether cis or trans is not critical.

Examples of operable species include

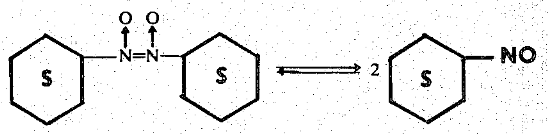

(I)

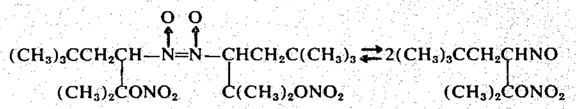

(II)

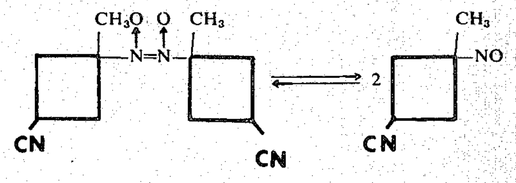

(III)

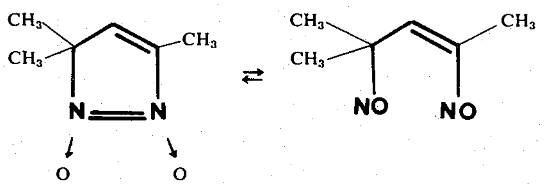
(IV)

$$HO(CH_2)_6\overset{O}{\overset{\uparrow}{N}}=\overset{O}{\overset{\uparrow}{N}}(CH_2)_6OH \rightleftarrows 2HO(CH_2)_6NO \quad (V)$$

$$[(CH_3)_3C]_2CH\overset{O}{\overset{\uparrow}{N}}=\overset{O}{\overset{\uparrow}{N}}CH[C(CH_3)_3]_2 \rightleftarrows 2[(CH_3)_3C]_2CHNO \quad (VI)$$

The compounds should have a relatively low molecular weight, i.e., the notroso compound in the monomeric form should preferably have not more than 20 carbon atoms.

The chromium compounds useful in the paste composition include the particulate chromium compounds $Cr_2O_3$, and $CrO_2$. Particulate chromium compounds have been found particularly suitable. The chromium compounds are preferably used in combination with the nitroso dimers, described above, to provide 0.05% to 7.0%, by weight, chromium, and preferably 0.5% to 5%, by weight, of chromium in the paste compositions. However, chromium and the particulate chromium compounds as well as the nitroso dimers may also be used as singular additives to a photohardenable paste composition to improve the resolution of fine lines and vias of conductive and dielectric films fired on a substrate.

The photohardenable compositions of the paste compositions of the present invention may be characterized as materials which undergo changes in various physical properties on exposure to actinic radiation. These change may include: an increase in hardness, tensile strength, or viscosity; a decrease in swelling, solubility, or sensitivity to attack by solvents; and an increase in melting point or flow temperature. These effects are usually induced by photochemical reactions in which new chemical bonds are formed through photo-induced polymerization and/or crosslinking. Photohardenable materials of the photopolymerizable type and their use as photosensitive layers are described in U.S. Pat. Nos. 2,760,863; 2,791,504; 2,929,022; 2,951,758; 3,129,098; 3,261,686; 3,418,118; 3,418,295; 3,448,089; 3,479,185, and 3,495,987. Photohardenable materials of the photocrosslinkable type useful in the paste compositions of the present invention are the cinnamic acid esters of polyols, polymers having chalcone and benzophenone type groups, and compositions described in Chapter 4 of "Light-Sensitive Systems," J. Kosar, John Wiley & Sons, Inc., New York (1965).

Suitable photohardenable compositions of the photopolymerizable type may comprise a polyfunctional acrylic monomer having more than one

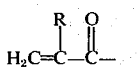

group, R being H or $CH_3$. Other suitable monomers may include, e.g., allylic or vinyl unsaturation. A preferred class of photopolymerizable monomers is the acrylates, including diacrylates, triacrylates, tetraacrylates, and methacrylates. Specific acrylates that have been found suitable are tetraethyleneglycol diacrylate, triethyleneglycol diacrylate, diethyleneglycol diacrylate, pentaerythritol triacrylate, 1,3-butanediol diacrylate, 1,4-butanediol diacrylate, 1,10-decamethyleneglycol diacrylate, 2,2-dimethylpropane diacrylate, 1,6-hexanediol diacrylate, pentaerythritol tetraacrylate, polyethyleneglycol diacrylate, 1,3-propanediol diacrylate, trimethylolpropane triacrylate, tripropyleneglycol diacrylate, ethylene diacrylate, and the corresponding methacrylates.

When a photopolymerizable monomer is used, a suitable sensitizer may be selected from the well known class of organic sensitizers including tertiary butyl anthraquinone, benzoin methyl ether, 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 2-chloro-2-methylanthraquinone alphasulfonic acid, 3-chloro-2-methylanthraquinone alphasulfonic acid, 3-chloro-2-anthraquinone, retenequinone, 7,8,9,10-tetrahydronaphthacenequinone, and 1,2,3,4-tetrahydrobenz(a)anthracene-7,12-dione, and mixtures of the above compounds. The amount of sensitizer may range from 0.02 to 2% by weight, of the paste composition and preferably will be in the range of 0.05 to 0.7% by weight of the paste composition.

Particularly suitable polymeric binders for use with photo-polymerizable monomers are the polyacrylates and polymethacrylates. Particular advantage is obtained by the use of high molecular weight polymers. Polymeric binders with inherent voscosities in the range of 1 to 2 are preferred. Similarly, when a photocrosslinkable composition is used in the photohardening paste composition of the invention it is preferred that the composition contain a polymeric component having an inherent viscosity in the range of 1 to 2. Inherent viscosity is measured by the method described in "Condensation Polymers of Interfacial and Solution Methods," P. W. Morgan, Interscience Publishers, New York (1965), Appendix B, at 469, using chloroform as the solvent at 25°C. Polymers having an inherent viscosity less than 1 result in poor adhesion of the paste composition to the substrate and inorganic particulate retention during development. Polymers having an inherent viscosity greater than 2 make it difficult to obtain the proper viscosity of the paste composition for screen printing and decrease the maximum loading of inorganic particulate in the paste composition. The binder should, therefore, preferably have a high molecular weight, e.g., 200,000–500,000. Additionally, it might decompose or burn cleanly during firing and not produce a carbonaceous residue.

The inorganic particulate constituent of the paste composition includes the well-known classes of inorganic materials which may be applied in a finely divided state to form, on firing, a fused film on a suitable substrate. These inorganic materials include metals, semi-conductors, refractory inorganic compounds and combinations thereof. Specific examples of such material are noble metals, inorganic oxides, glasses, sulfides, silicides, borides, and carbides. The inorganic particulates are incorporated in the paste composition in finely divided form. In order to obtain the high resolution desired by photoimaging patterns or layers of the paste composition, the largest dimension of the finely divided particulate matter should not exceed the desired line or pattern length or width, and preferably the particle size will remain below about 20% of the resolution of the line or pattern length or width desired. For example, for one mil lines, particle size should be less than 5 microns, and preferably at least 90% by weight of the finely divided inorganic material should have a particle size of at least 0.5 micron. Further, when the desired line resolution is exceeded by the desired space resolution between lines, the maximum particle size should be less than about 20% of the spacing between lines. Spherical-shaped particles are the preferred form when the finely divided particulate material is opaque to actinic radiation. When the particulate inorganic solids are transparent to the actinic radiation, e.g., UV transparent glasses, the minimum particle size is not as critical, and a range of 0.01–40 microns may be used. A preferably range of particle sizes where the inorganic materials are not entirely opaque is from 0.01 to 15 microns.

The photohardenable paste compositions of the invention must have the proper rheology for screen printing to be compatible with commonly used thick-film techniques and also must contain a sufficient volume of inorganic particulates to provide functional elements, e.g., conductive or insulative patterns or layers. Additionally, the compositions must be capable of photoimaging at the coated layer or dried film thickness, e.g., from 0.05 mil up to about 1.0 mils when the inorganic particulate material is opaque and from 0.05 mil up to about 5 mils when it is transparent to actinic radiation, to provide the high resolution patterns and layers desired. This latter requirement is difficult to meet in view of the fact that the resolution obtainable decreases when increased thickness is required, particularly when the inorganic particulate is opaque to the region of spectral sensitivity of the photohardenable material. Although the above limitations can be overcome by decreasing the inorganic particulate material loading of the paste composition and multiple printing or exposure of patterns or layers, these latter solutions are undesirable, as they result in lower resolution by photoimaging techniques and lower yields of acceptable circuit elements.

The liquid vehicle for dispersing the other constituents of the photohardenable paste composition of the invention, must readily dissolve or suspend all the constituents, including the inorganic solids. the liquid vehicle must be inert towards constituents of the paste composition. Additionally, it should be essentially removed from the paste composition by drying prior to photoimaging. Remaining vehicle will cause the layer to be soft and tacky and adhere to the mask during exposure. Further, the vehicle should be free of resinous high boiling components that would not be readily removable by drying, and which would prevent the thorough removal of the particulate material in the unimaged areas with the development solvent. For this purpose, the vehicle of the paste composition must be substantially free of reactive groups which may interact with other constituents in unhardened areas or form resinous deposits on exposure to air, other processing environment, or processing solutions. Hydrogenated terpenes, substantially free of such reactive groups, have been found particularly suitable for use as the liquid vehicle, however, other vehicles which will dissolve or suspend the ingredients including the inorganic particulate matter may be used. Examples of useful solvents include cyclohexanone, amyl acetate, cellosolve, butanol, nitrobenzene, toluene, xylene, and the terpenes, such as pinene, terpineol, dipentene, dipentene oxide, and essential oils, such as oils of lavendar, rosemary, aniseed, sassafras, wintergreen, fennel, terpentine and the hydrogenation products thereof as described above.

The photohardenable paste compositions of the invention are formulated to contain the greatest practical volume of inorganic particulate materials per unit volume of liquid phase. The liquid phase of the compositions for this purpose include all the constituents except the inorganic particulate.

Optional ingredients may be included in the paste composition to improve adhesion, alter viscosity, modify rheological properties, aid in the dispersion of the inorganic solids, or improve the efficiency of the development process, e.g., silanes, ionic and nonionic surfactants and soybean lecithin are typical of such optional ingredients.

The operable and preferred ranges of constituents in the compositions of the invention are as follows, all percent by weight.

| Constituent | Operable | Preferred |
|---|---|---|
| Inorganic particulate material | 20–75 | 30–60 |
| Polymeric binder | 2–35 | 3–21 |
| Monomers | 0–10 | 0–6 |
| Sensitizer | 0.02–1 | 0.05–0.7 |
| Solvent | 20–75 | 30–60 |
| Nitroso Dimer | 0.01–1.0 | 0.03–0.60 |
| Chromium (percent Cr based on the total weight of the paste composition) | 0.05–7.0 | 0.3–5.0 |

The photohardenable paste compositions of the invention may be formulated by dissolving or suspending the polymeric binder, monomer, and sensitizer in the liquid vehicle mixing in the finely divided inorganic particulate and milling the composition to a paste on a three-roll mill such as an ointment mill. the photohardenable paste composition may be forced through a fine screen to remove undispersed particles. To insure uniform dispersion of all the constituents in the composition, a separate solution or suspension of the constituents may first be made using aliquot portions of the vehicle. The finely divided inorganic particulate material may be pretreated by a first dispersion in the vehicle and dried, and then redispersing of the inorganic particulate in the combined aliquot portions in which the other constituents have first been dispersed. The entire formulation may then be milled and screened to provide the paste composition. The particulate chromium compounds and nitroso dimer may be added to the paste composition and the mixture mulled until thoroughly mixed to produce the paste compositions of the invention. Photohardenable paste compositions so prepared may be packaged in a tube or jar which is opaque to actinic radiation. The packaged compositions are provided to electronic circuit fabricators ready for use in screen-printing machines, which are well known in the art of fabricating thick-film electronic circuits. The packaged photohardenable paste composition will remain stable for months. The paste compositions eliminate the mixing of photoresist solutions and the dispersion of inorganic particulate material in the solutions by the circuits manufacturer. Additionally, the paste compositions, as before stated, are compatible with screen-printing techniques which are well known in the art. They eliminate the necessity for roll or spin coating by the circuit manufacturer or the substrate on which high-resolution pattern or layers of conductive material are to be photoimaged.

The photohardenable paste compositions of this invention may be applied to any suitable substrate, e.g., alimina, glass, barium titanate, saphire, berylia, steatite, fostorite, zircon, ferrites, and ferroelectric or semiconductor substrates, e.g., silicon or germanium, or temperature-resistant plastics, e.g., polyimides, or polysulfones. According to the process of the invention, the photohardenable paste composition may be applied to a substrate by screen-printing or stencilling either over the entire area of the substrate or on a selected area of the substrate, only slightly larger than the area that the desired high resolution pattern or layer is to occupy. The printed pattern is then dried at a moderate temperature, e.g., 40°C. to 75°C. to evaporate liquid vehicle without significant loss of the other liquid constituents of the paste composition. The substrate having the desired pattern of the dried paste composition may then be placed in a vacuum frame. A mask or transparency, bearing the high resolution pattern desired thereon, may be placed over the substrate. The subsequent application of a vacuum tends to reduce the concentration of polymerization inhibiting oxygen dissolved in the paste composition and provides intimate contact between the screen-printed pattern and the mask. The applied vacuum should not exceed 100 torr and preferably will be in the range of 1 to 10 torr. The photohardenable compositions may then be imagewise exposed through the mask to actinic radiation for a sufficient period of time to cause photohardening of the exposed areas. The substrate, having the exposed photohardened composition thereon, may be removed from the vacuum frame and washed with a suitable solvent to remove unhardened areas on inorganic particulate material in the unhardened areas of the composition. Optionally, the photohardenable composition may be preexposed in air after screen-printing on the substrate to consume or partially consume dissolved oxygen or other impurities in the composition which might inhibit the photohardening and resultant image on exposure.

Suitable sources of actinic radiation for photohardenable composition are, e.g., mercury lamps, carbon arcs, xenon arcs, and xenon flash tubes. Air streams or circulating water may be provided to cool the substrate in the vacuum frame to prevent the photohardenable composition from adhering to the mask and eliminate any possibility of heat-induced polymerization in the unexposed area of the composition. Suitable solvents for removing the unexposed areas include carbon tetrachloride, chloroform, isobutyl alcohol, trichloroethylene, perchloroethylene and chlorinated fluorocarbons. Alternatively, the unexposed areas may be removed by a dry process, e.g., in air stream or a gentle mechanical abrasion such as brushing. the photohardenable high resolution pattern may then be fired to burn or decompose the photohardened binder and to sinter or fuse the inorganic particulate material to form a functional element on the substrate. Typically, the temperature of the substrate is brought from room to peak firing temperature in about 5 to 45 minutes. The peak temperature is maintained for a few minutes, and the substrate is gradually returned to room temperature. Ventilation should be provided during firing to remove the organic decomposition products of the photohardened material.

For the following examples, a hydrogenated terpene vehicle was prepared by the hydrogenation of a mixture of alpha and beta terpineol. The paste compositions were prepared for the following examples by first dispersing a monomer, polymeric binder, and sensitizer in the above-described vehicle. The inorganic solid constituent was pretreated by dispersion in the vehicle; then dried and redispersed with the monomer/binder/-sensitizer dispersion in vehicle; milled to form a paste on a three-roll mill; and then screened to remove undispersed particulate material.

EXAMPLES

In the examples below a paste composition was prepared according to the above procedure, containing 20 weight per cent solution of polyisobutyl methacrylate dissolved in dihydroterpineol, 19.5 parts by weight glass powder having a particle size of 1-12 microns, 21.60 parts by weight diethyleneglycol diacrylate/tetraethyleneglycol diacrylate monomers 60/40 (wt/wt) 1.27 parts by weight benzoin methyl ether sensitizer (50% by weight, solution in dihydroterpineol, 0.36 parts by weight The mixture was roll milled until a smooth paste containing well dispersed glass particles was obtained. The glass powder composition was a mixture of:

| | |
|---|---|
| $SiO_2$ | 49.20% |
| $Al_2O_3$ | 6.94% |
| $TiO_2$ | 2.01% |
| PbO | 20.66% |
| CaO | 0.06% |
| BaO | 10.34% |
| $Na_2O$ | 0.80% |
| $K_2O$ | 9.56% |
| $B_2O_3$ | 0.15% |
| $Sb_2O_3$ | 0.29% |
| | 100% |

all percentages by weight of the glass mixture. The glass powder was prepared by melting together the above constituents, fritting it and then ball milling the frit. The powder was treated with vehicle to improve dispersability.

The particulate chromium compounds and the nitroso dimers were added to the paste composition described above and mulled until thoroughly mixed. Coatings of the compositions below were applied to 96% alumina substrates by screen-printing the resultant paste compositions using a 63 mesh Nytex screen and dried for 15 minutes in a stream of air at 60°C. to form a film. The print and dry sequence was repeated to provide a total coating thickness of 2.0–2.2 mils on the substrates. The coated substrates were then masked with a clear photographic negative containing a pattern of opaque squares 10, 5, 3, 2 and 1 mil on a side, placed in a vacuum frame under a vacumm of 1–2 torr, and the coating was imagewise exposed using a 250 watt medium pressure mercury vapor lamp at a distance of 10 inches. The imagewised exposed coatings were developed in a spray of perchloroethylene at 75 psi and a distance of 2–3 inches for 5–7 seconds. The developed coatings were dried in a stream of air and fired at 850°–925°C. to produce fired films on the substrate. The fired films substantially retained the resolution of the developed unfired films listed in Table I. All percentages in Table I are by weight based on the total weight of the composition.

In the control example exposure times were varied from 1/50 to 10 seconds. For exposure times of less than 1 second, polymerization was incomplete in the exposed areas and the coating was partially washed away during development. For exposure times greater than 1 second the exposed areas remained intact but the unexposed areas could not be washed out.

In Example A exposure times up to 15 seconds gave incomplete polymerization in the exposed areas with subsequent destruction of the coating. For exposure times in excess of 15 seconds, only the unpolymerized areas 10 mils on a side could be washed free of glass, even under intense spraying which caused disruption of the coating in the polymerized areas.

In Example B, exposure times of 1 second resulted in the exposed areas of the coating having holes after development, indicating incomplete polymerization, yet the unexposed areas could not be washed free of glass. After exposure times greater than 1 second, the unexposed areas could not be washed out without disturbing the exposed areas.

In Example I exposure times of 5 seconds produced 10, 5 and 3 mil areas which could be washed clean of glass, but small holes in the exposed areas of the coating indicated incomplete polymerization. Exposure times of 10–35 seconds produced 10 and 5 mil unexposed areas cleanly resolved and washed free of glass. The exposed areas were polymerized and undisturbed by the development of the unexposed areas.

In Example 2–7, using the six different dimers of page 8 and exposure times of 10–25 seconds, cleanly resolved 5 mil vias in the unexposed areas which were readily washed free of glass without disturbing the exposed polymerized areas were obtained.

Examples 8–16 resulted in cleanly resolved vias in the exposed areas at the exposure times given in Table I. The unexposed polymerized areas were undisturbed by development.

I claim:

1. A film forming photohardenable paste composition comprising from about 20 to about 75 weight percent of finely divided inorganic material capable on firing of being fused into an element of an electronic circuit, from about 2 to about 35 weight percent of a polymeric binder, not more than about 10 weight percent of a photopolymerizable monomer, from about 0.02 to about 1 weight percent of an organic sensitizer, from about 20 to about 75 weight percent of a solvent, from about 0.01 to about 1.0 weight percent of a nitroso dimer having a dissociation constant in solution at 25°C. of from about $10^{-2}$ to about $10^{-10}$ with a rate of dissociation in solution with a half life comparable to the exposure time of the paste composition, and from about 0.05 to about 7.0 weight percent chromium present at either the free metal or an oxide thereof.

TABLE I

| Example | Paste (g) | $Cr_2O_3$ | Dimer | Exposure | Resolution (mils) |
|---|---|---|---|---|---|
| Control | 4.27 | — | — | 1/50–10 sec. | — |
| A | 4.27 | 0.038 g | — | 1/50–60 sec. | 10. |
| B | 4.27 | — | 0.004 g* | 1–30 sec. | — |
| 1 | 4.27 | 0.038 g | 0.004 g* | 5–35 sec. | 5 |
| 2-7 | 4.27 | 0.038 g | 0.004 g | 10–25 sec. | 5 |
| 8 | 4.31 | 0.023% | 0.02% | 5 sec. | 10 |
| 9 | 4.31 | 0.023% | 0.58% | 60 sec. | 10 |
| 10 | 4.31 | 1.15% | 0.02% | 5 sec. | 10 |
| 11 | 4.31 | 1.16% | 0.12% | 60 sec. | 5 |
| 12 | 4.31 | 4.43% | — | 30 sec. | 5 |
| 13 | 4.31 | 4.43% | 0.02% | 45 sec. | 3 |
| 14 | 4.31 | 4.43% | 0.11% | 30 sec. | 5 |
| 15 | 4.31 | 4.43% | 0.55% | 5 min. | 5 |
| 16 | 42.70 | 0.24 g ($CrO_2$) | 0.04 g | 30 sec. | 5 |

*dissolved in 2 cc of dihydroterpineol

1. The nitrosocyclohexane dimer of Formula I, page 8, was used in Examples B, 1, 2 and 8–16. The nitroso dimers of Formula II–VI, page 8, were respectively used in Examples 3–7. In Example 10 $CrO_2$ was used in place of $Cr_2O_3$.

2. The composition of claim 1 wherein the polymeric binder is a polyacrylate or a polymethacrylate.

3. The composition of claim 2 wherein the polymeric binder has a molecular weight of from about 200,000 to about 500,000.

4. A composition according to claim 1, wherein said nitroso dimer is selected from the group consisting of

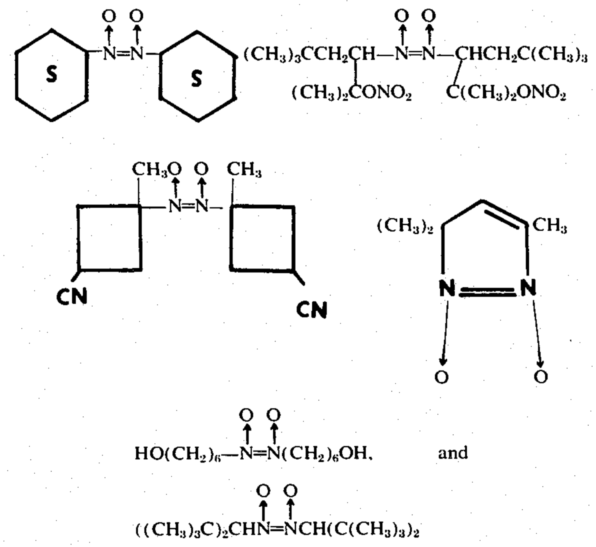

and said chromium is a particulate chromium compound selected from the group consisting of $Cr_2O_3$ and $CrO_2$.

5. A composition according to claim 4, wherein said inorganic particulate material is a finely divided noble metal.

6. A composition according to claim 5 wherein said inorganic particulate is a noble metal selected from the group consisting of gold, silver, palladium and platinum or mixtures thereof.

7. A composition according to claim 6, wherein said noble metal is gold.

8. A composition according to claim 6, wherein said noble metal is silver.

9. A composition according to claim 6, wherein said noble metal is platinum.

10. A composition according to claim 6, wherein said noble metal is palladium.

11. A composition according to claim 5, wherein said inorganic particulate material additionally includes a glass frit.

12. A composition according to claim 5, wherein said inorganic particulate material additionally includes bismuth oxide.

13. A composition according to claim 3, wherein said inorganic particulate material is a dielectric material.

14. A composition according to claim 13, wherein said dielectric material is a glass frit.

15. A composition according to claim 3, wherein said liquid vehicle is a hydrogenated terpene.

16. A composition according to claim 1, wherein said photopolymerizable monomers are acrylates.

17. A composition according to claim 1, wherein the polymeric binder is polyisobutyl methacrylate.

18. A composition according to claim 1, wherein the organic sensitizer is benzoin methyl ether.

19. A composition according to claim 16, wherein said photopolymerizable monomers are diethyleneglycol diacrylate and tetraethyleneglycol diacrylate.

* * * * *